(12) United States Patent
Xiao et al.

(10) Patent No.: US 11,444,141 B2
(45) Date of Patent: Sep. 13, 2022

(54) DISPLAY PANEL WITH SEPARATED PIXEL CIRCUIT REGIONS

(71) Applicant: Shenzhen China Star Optoelectronics Semiconductor Display Technology Co., Ltd., Shenzhen (CN)

(72) Inventors: Xiang Xiao, Shenzhen (CN); Baixiang Han, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/622,913

(22) PCT Filed: Aug. 27, 2019

(86) PCT No.: PCT/CN2019/102753
§ 371 (c)(1),
(2) Date: Dec. 16, 2019

(87) PCT Pub. No.: WO2020/228178
PCT Pub. Date: Nov. 19, 2020

(65) Prior Publication Data
US 2022/0059622 A1    Feb. 24, 2022

(30) Foreign Application Priority Data

May 13, 2019  (CN) .......................... 201910391976.9

(51) Int. Cl.
*H01L 27/32*    (2006.01)

(52) U.S. Cl.
CPC .................................. *H01L 27/326* (2013.01)

(58) Field of Classification Search
CPC ........................ H01L 27/326; H01L 27/3276
See application file for complete search history.

(56) References Cited

U.S. PATENT DOCUMENTS

| 6,011,531 A | 1/2000 | Mei et al. | |
| 2015/0243722 A1* | 8/2015 | Kwon | H01L 27/3265 257/40 |
| 2017/0263895 A1* | 9/2017 | Lee | H01L 27/3211 |

FOREIGN PATENT DOCUMENTS

| CN | 106353908 A | 1/2017 |
| CN | 110164927 A | 8/2019 |
| JP | 2012068573 A | 4/2012 |
| KR | 20060077362 A | 7/2006 |

\* cited by examiner

*Primary Examiner* — Suberr L Chi
(74) *Attorney, Agent, or Firm* — Nathan & Associates; Menachem Nathan

(57) ABSTRACT

The present disclosure provides a display panel including gate lines and data lines disposed on a base substrate. The base substrate is further divided into pixel regions including transparent regions and pixel circuit regions having pixel circuits. The pixel circuit regions of at least two adjacent pixel regions are disposed next to each other and form a pixel circuit joining region, so that the pixel circuit regions of a same row or a same column of the pixel regions are arranged spaced apart from each other. Two adjacent pixel circuit joining regions are spaced apart by the transparent regions.

18 Claims, 2 Drawing Sheets

DISPLAY PANEL WITH SEPARATED PIXEL CIRCUIT REGIONS

FIELD OF INVENTION

The present disclosure relates to the field of display technology, more particularly, to a display panel.

BACKGROUND OF INVENTION

In conventional transparent display panel designs, a single pixel region includes a transparent region and a non-transparent region. The transparent region is transparent for light transmission. The non-transparent region includes a pixel circuit region. In conventional designs, the pixel circuit regions and the transparent regions are often in shapes of strips. However, grating effect occurs easily in such designs when the display panel is lit. As a result, it seems that there are dense dark lines in images, thereby affecting the display effect.

Therefore, drawbacks exist in the conventional technologies, and improvements are urgently required.

SUMMARY OF INVENTION

The present disclosure provides a display panel which can reduce grating effect of the display panel in order to enhance transparent display effect of the display panel.

To solve above-mentioned problems, the present disclosure provides the following technical solutions.

The present disclosure provides a display panel includes:

A base substrate.

A plurality of gate lines are arranged along a row on the base substrate and a plurality of data lines are arranged along a column on the base substrate. The base substrate further includes pixel regions arranged in an array.

The pixel region includes transparent regions and pixel circuit regions. The pixel circuit regions include pixel circuits.

The pixel circuit regions of at least two adjacent ones of the pixel circuit regions are disposed next to each other and form a pixel circuit joining region. Thus, the pixel circuit regions of a same row of the pixel regions or pixel circuit regions of the same column of the pixel regions are arranged spaced apart from each other, so that two adjacent ones of the pixel circuit joining regions are spaced apart by the transparent regions.

In the display panel of the present disclosure, the pixel circuit joining regions are formed by at least three of the pixel regions arranged in the same row, or the pixel circuit joining regions are formed by at least three of the pixel regions arranged in the same column. The pixel circuit regions of the at least three pixel regions in the same row or the same column are arranged next to each other. Each of the pixel circuit regions which is disposed at two ends of the pixel circuit joining region has an area smaller than an area of the other pixel circuit regions for making adjacent two of the pixel circuit joining regions be spaced apart by the transparent rejoin.

In the display panel of the present disclosure, in the pixel regions forming the pixel circuit joining regions, two ends of the transparent regions of adjacent two of the pixel regions are connected to each other and surround the pixel circuit joining regions.

In the display panel of the present disclosure, the pixel circuit joining region comprises the pixel circuit regions of four of the pixel regions, wherein areas of the transparent regions of the four pixel regions are equal, and the pixel circuit regions of the four of the pixel regions are also equal.

In the display panel of the present disclosure, a shape of the pixel circuit joining region is rectangle and a shape of the pixel circuit region is also rectangle.

In the display panel of the present disclosure, a shape of the pixel circuit joining region is rhombus, and a shape of the pixel circuit region is triangle.

In the display panel of the present disclosure, the display panel further includes a light-emitting unit. The pixel circuit provides a driving signal to the light-emitting unit. The light-emitting unit includes an anode electrode, a light-emitting layer and a cathode electrode stacked on each other.

In the display panel of the present disclosure, the anode electrode, the light-emitting layer, and the cathode electrode are arranged corresponding to the pixel circuit region.

In the display panel of the present disclosure, the light-emitting layer is disposed corresponding to the pixel circuit region. The anode electrode and/or the cathode electrode share the pixel circuit region and the transparent region. The anode electrode and/or the cathode electrode are made of a transparent material.

To solve the above-mentioned technical problems, the present disclosure further provides a display panel includes:

A base substrate.

A plurality of gate lines are arranged along a row on the base substrate and a plurality of data lines are arranged along a column on the base substrate. The base substrate further includes pixel regions arranged in an array.

The pixel region includes transparent regions and pixel circuit regions. The pixel circuit regions include pixel circuits.

The pixel circuit regions of at least two adjacent ones of the pixel circuit regions are disposed next to each other and form a pixel circuit joining region. Thus, the pixel circuit regions of a same row of the pixel regions or pixel circuit regions of the same column of the pixel regions are arranged spaced apart from each other, so that two adjacent ones of the pixel circuit joining regions are spaced apart by the transparent regions. A border line between the transparent region and the pixel circuit regions is a straight line, a polygonal line, or a curved line.

In the display panel of the present disclosure, the pixel circuit joining regions are formed by at least three of the pixel regions arranged in the same row, or the pixel circuit joining regions are formed by at least three of the pixel regions arranged in the same column. The pixel circuit regions of the at least three pixel regions in the same row or the same column are arranged next to each other. Each of the pixel circuit regions which is disposed at two ends of the pixel circuit joining region has an area smaller than an area of the other pixel circuit regions. Thus, adjacent two of the pixel circuit joining regions are spaced apart by the transparent rejoin.

In the display panel of the present disclosure, in the pixel regions forming the pixel circuit joining regions, two ends of the transparent regions of adjacent two of the pixel regions are connected to each other and surround the pixel circuit joining regions.

In the display panel of the present disclosure, the pixel circuit joining region includes the pixel circuit regions of four of the pixel regions. Areas of the transparent regions of the four pixel regions are equal. The pixel circuit regions of the four of the pixel regions are also equal.

In the display panel of the present disclosure, a shape of the pixel circuit joining region is rectangle and a shape of the pixel circuit region is also rectangle.

In the display panel of the present disclosure, a shape of the pixel circuit joining region is rhombus, and a shape of the pixel circuit region is triangle.

In the display panel of the present disclosure, the display panel further includes a light-emitting unit. The pixel circuit provides a driving signal to the light-emitting unit. The light-emitting unit includes an anode electrode, a light-emitting layer and a cathode electrode stacked on each other.

In the display panel of the present disclosure, the anode electrode, the light-emitting layer, and the cathode electrode are arranged corresponding to the pixel circuit region.

In the display panel of the present disclosure, the light-emitting layer is disposed corresponding to the pixel circuit region. The anode electrode and/or the cathode electrode share the pixel circuit region and the transparent region. The anode electrode and/or the cathode electrode are made of a transparent material.

The beneficial effects are as following. The display panel of the present disclosure separates the pixel circuit regions from each other by adjusting the arrangement of the pixel circuit regions (non-transparent regions) of the pixels; thereby, the pixel circuit regions are prevented from being arranged in an entire row. As a result, grating effect of the display panel is weakened and the transparency of the display panel is improved. On the other hand, the area of transparent regions is maximized by adopting the arrangement of the present disclosure. In the meanwhile, the transparency of the display panel is improved.

DESCRIPTION OF DRAWINGS

In order to clarify embodiments or technical solutions of the present technologies, the required drawings of the embodiments or the technical solutions will be briefly described below. Obviously, the drawings in the following description are merely parts of embodiments. Additional drawings may be obtained by a skilled person in the art without creative effort according to the following drawings.

DETAILED DESCRIPTION OF PREFERRED EMBODIMENTS

Figure 1:
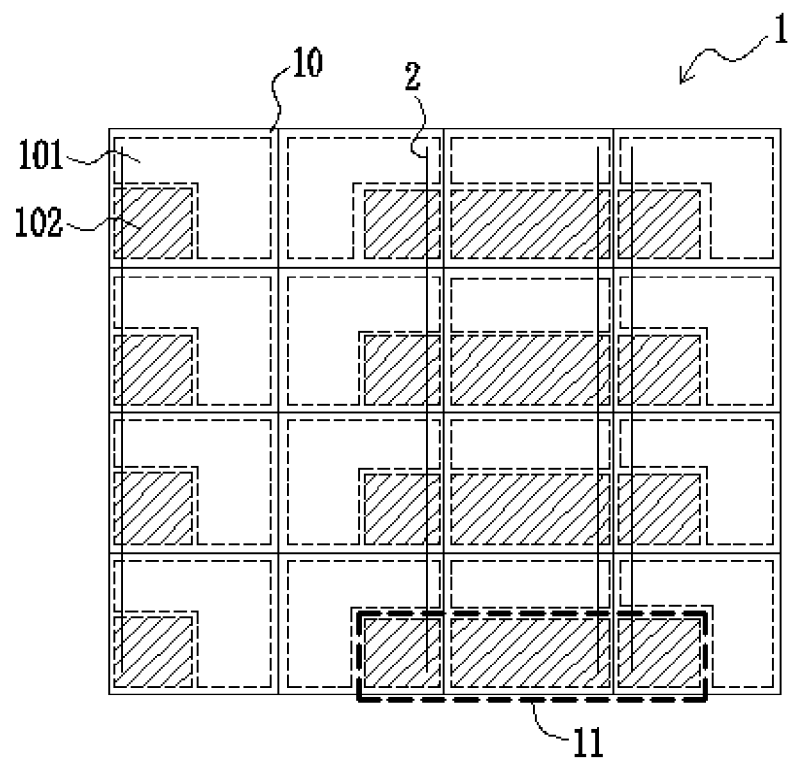
FIG. 1 illustrates a structural diagram of a display panel of a first embodiment of the present disclosure.

The following description of the various embodiments is provided with reference of drawings to illustrate specific embodiments. Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. In the drawing, structurally similar elements are denoted by the same reference numbers.

The present disclosure focuses on grating effect occurring in the existing display panels, which results from the bar-shape designs of the pixel circuit regions and transparent regions. The grating makes images have dense dark lines, thereby affecting the display effect. The present disclosure can solve these drawbacks.

The display panel of the present disclosure is a transparent display panel. The display panel includes a base substrate. A plurality of gate lines arranged along a row on the base substrate and a plurality of data lines arranged along a column on the base substrate. The base substrate further includes pixel regions arranged in an array. One of the pixel regions includes a transparent region and a pixel circuit region. The pixel circuit region includes a pixel circuit. The pixel circuit regions are non-transparent regions.

The pixel circuit regions of at least two adjacent pixel regions are disposed next to each other and form a pixel circuit joining region. Thus, the pixel circuit regions of the same row of the pixel regions or pixel circuit regions of the same column of the pixel regions are arranged spaced apart from each other in order to prevent the pixel circuit regions (i.e. non-transparent regions) from being arranged in an entire row or an entire column. As a result, the two adjacent pixel circuit joining regions are spaced apart by the transparent regions. Therefore, the grating effect is reduced and the transparent regions are maximized for enhancing the transparency of the display panel.

It should be understood that the "disposed next to each other" in the present disclosure refers to location of the pixel circuit regions, which will not substantially affect the pixel circuits of adjacent pixels.

In each of the pixel regions, shapes of the transparent regions and the pixel circuit regions can be rectangle, triangle, or other types of polygons, etc., and are not specifically limited by the present disclosure; furthermore, the shapes of the transparent regions and the pixel circuit regions can be regular or irregular, and are not specifically limited. Borderlines of the transparent regions and the pixel circuit regions can be one or more of straight lines, polygonal lines, and curved lines, and are also not specifically limited by the present disclosure.

The technical solutions provided by embodiments of the present application are described below in detail accompanied by drawings.

FIG. 1 illustrates a structural diagram of a display panel of a first embodiment of the present disclosure. The display panel includes a base substrate 1. A plurality of gate lines (not shown) are arranged along a row on the base substrate 1 and a plurality of data lines 2 are arranged along a column on the base substrate 1. The base substrate 1 further comprises pixel regions 10 arranged in an array. The figure takes a 4*4 pixel array as an example in the following description.

In each single pixel, the pixel region 10 includes a transparent region 101 and a pixel circuit region 102. The pixel circuit region 102 includes a pixel circuit. The pixel circuit and the data line 2 are electrically connected to the gate line. It should be understood that the pixel circuit includes a thin-film transistor, a storage capacitor, and other signal wires, etc.

The display panel further includes a light-emitting unit. The pixel circuit provides a driving signal to the light-emitting unit. The light-emitting unit includes an anode, a light-emitting layer, and a cathode disposed in a stack.

In this embodiment, at least three pixel regions 10 arranged in the same row or the same column in the pixel region have pixel circuit regions 102 which are arranged next to each other. Thus, pixel circuit joining regions 11 are divided into segments.

In the figure, the pixel circuit joining regions 11 are formed by the pixel circuit regions 102 of the at least three pixel regions 10 arranged in the same row or the same column. The pixel circuit regions 102 of the at least three pixel regions 10 are arranged next to each other. The pixel circuit regions 102 are disposed at two ends of the pixel circuit joining region 11, and have areas smaller than areas of pixel circuit regions 102 arranged in middle; thereby, two adjacent pixel circuit joining regions 11 are spaced apart by the transparent region 101.

Therefore, by adjusting the areas of the pixel circuit regions 102 of each of the pixel regions 10, the pixel circuit regions 102 are prevented from being arranged in an entire row. As a result, grating effect is reduced and display effect of the display panel is enhanced.

Obviously, in other embodiments, the separately disposed pixel circuit regions 102 can be achieved by only adjusting a ratio of length to width of the pixel circuit regions 102, without adjusting areas of the pixel circuit regions 102.

Figure 2:
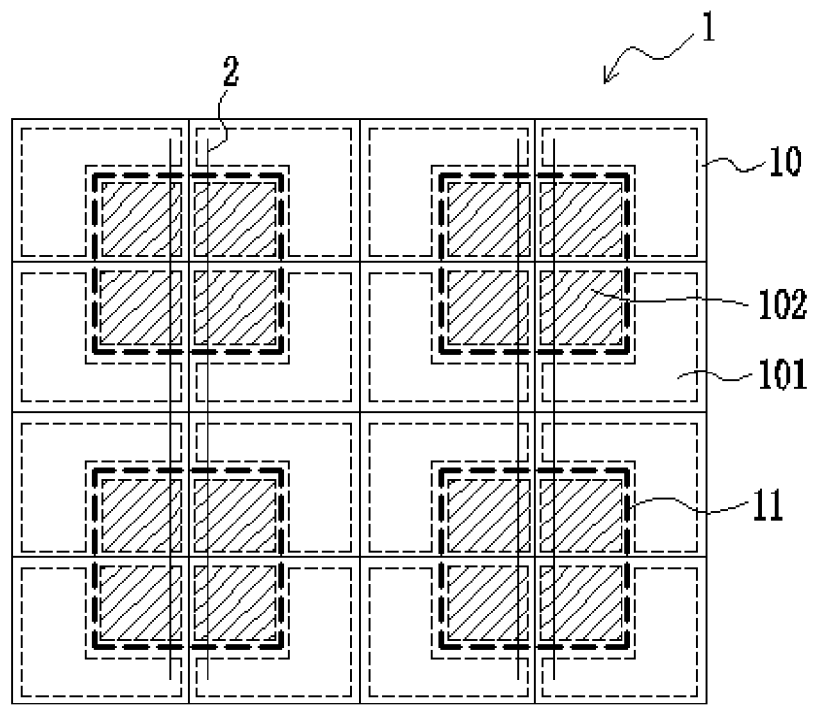
FIG. 2 illustrates a structural diagram of a display panel of a second embodiment of the present disclosure.

FIG. 2 illustrates a structural diagram of a display panel of a second embodiment of the present disclosure. A distinctive feature of the second embodiment from the first embodiment is: in the pixel regions 10 which are utilized to form the pixel circuit joining regions 11, two ends of the transparent regions 101 of two adjacent pixel regions 10 are connected to each other and surround the pixel circuit joining regions 11.

The figure takes a 4*4 pixel as an example in the description. The pixel circuit joining regions 11 include pixel circuit regions 102 of four pixel regions 10. The shapes of the four pixel circuit regions 102 are rectangle (square) and the four pixel circuit regions 102 are disposed close to each other; thereby, the shape of the formed pixel circuit joining regions 11 is also rectangle (square).

In this embodiment, areas of the transparent regions 101 of the four pixel regions 10 are equal. Areas of the pixel circuit regions 102 of the four pixel regions 10 are also equal.

In other words, the areas of each of the transparent regions 101 of the four pixel regions 10 are equal. Areas of each of the pixel circuit regions 102 of the four pixel regions 10 are also equal.

The present disclosure keeps the areas of transparent regions 101 in a single pixel region 10 unchanged, and sets shapes of the pixel circuit regions 102 as squares. Four adjacent pixel circuit regions 102 form the pixel circuit joining regions 11 shaped in a larger square. The pixel circuit joining regions 11 are surrounded by the transparent regions 101; thereby, the area of the transparent region 101 becomes larger. As a result, transparency becomes better and the grating effect is weakened because the pixel circuit regions 102 will not be arranged in an entire row.

Figure 3:
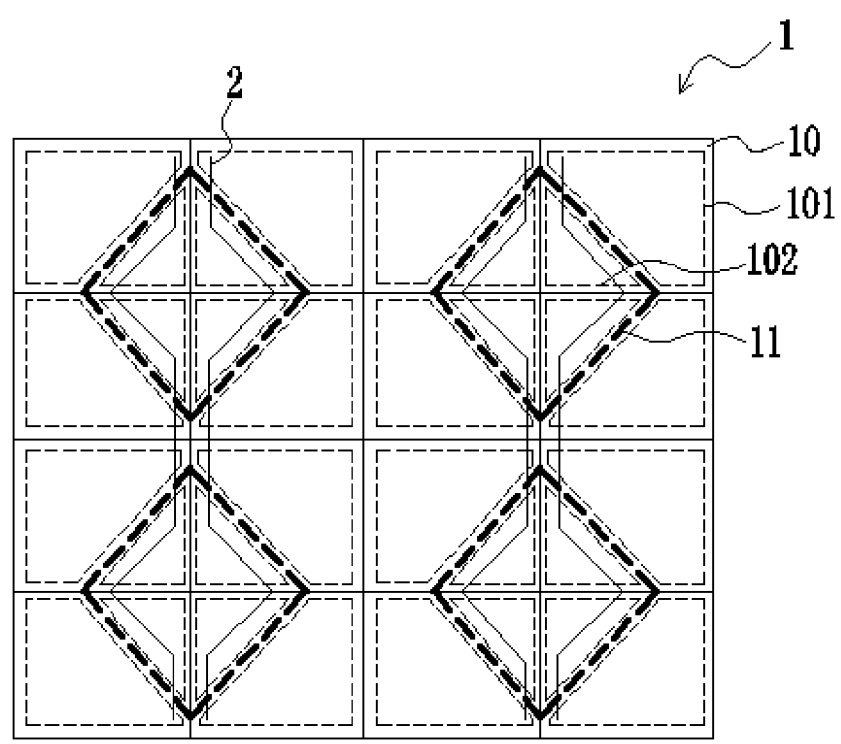
FIG. 3 illustrates a structural diagram of a display panel of a third embodiment of the present disclosure.

FIG. 3 illustrates a structural diagram of a display panel of a third embodiment of the present disclosure. A distinctive feature of the third embodiment from the second embodiment is: the transparent region 101 of the second embodiment includes several right angles. The third embodiment sets the shape of the pixel circuit regions 102 as triangles without changing the area value of the transparent region 101 of single pixel regions. The shape of pixel circuit joining regions 11 formed by the pixel circuit regions 102 of the four pixel regions 10 is rhombus.

By adopting this arrangement, not only is the grating effect weakened due to the rectangular arrangement of the pixel circuit regions 102, but the transparent regions 101 are also prevented from having too many right angles, or prevented from having any right angle. As a result, a better transparency effect is achieved and the display effect of the display panel is improved.

As shown in the figures, the portions of the data lines located in the transparent regions 101 are straight lines, and the portions of data lines located in the pixel circuit regions 102 are polygonal lines. Obviously, the portions located in the pixel circuit regions 102 may also be straight lines. The specific design methods are determined according to the practical design requirement of pixels, which are not limited herein.

In one of the embodiments, locations of the anode, the light-emitting layer, and the cathode correspond to the location of the pixel circuit region 102.

In one of the embodiments, the location of the light-emitting layer corresponds to the location of the pixel circuit region 102. The anode and/or the cathode share the pixel circuit region 102 and the transparent region 101. The anode and/or the cathode are both made of a transparent material.

In one of the embodiments, the display panel includes, but is not limited to, a top-emitting organic light-emitting diode transparent display panel.

There are only three provided embodiments, but any modified designs according to the aspects of the present disclosure fall in the protected scope of the present disclosure. For example, shapes of the pixel circuit regions 102 can be designed as polygons (like hexagons or octagons) or discs.

To conclude, the display panel of the present disclosure separates the pixel circuit regions from each other by adjusting the arrangement of the pixel circuit regions (non-transparent regions) of the pixels; thereby, the pixel circuit regions are prevented from being arranged in an entire row. As a result, grating effect of the display panel is weakened and the transparency of the display panel is improved. On the other hand, the area of transparent regions is maximized by adopting the arrangement of the present disclosure, thereby the transparency of the display panel is improved.

To conclude, although the present disclosure has been disclosed by above-mentioned preferred embodiments, the above-mentioned preferred embodiments are not limitations to the present disclosure. Variations and modifications can be obtained by a person skilled in the art without departing from the aspect and scope of the present disclosure. Therefore, the protected scope of the present disclosure is subject to the scope defined by the claims.

What is claimed is:

1. A display panel, comprising:
    a base substrate;
    a plurality of gate lines arranged along a row on the base substrate and a plurality of data lines arranged along a column on the base substrate, and the base substrate further comprising pixel regions arranged in an array;
    wherein the pixel regions comprise transparent regions and pixel circuit regions, and the pixel circuit regions comprise pixel circuits; and
    wherein the pixel circuit regions of at least two adjacent pixel regions are disposed next to each other and form a pixel circuit joining region, so that the pixel circuit regions of a same row or a same column of the pixel regions are arranged spaced apart from each other, and two adjacent pixel circuit joining regions are spaced apart by the transparent regions.

2. The display panel according to claim 1, wherein the pixel circuit joining region is formed by at least three pixel regions arranged in the same row or the same column, wherein the pixel circuit regions of the at least three pixel regions in the same row or the same column are arranged next to each other, and each of the pixel circuit regions disposed at two ends of the pixel circuit joining region has an area smaller than an area of other pixel circuit regions, so that the two adjacent pixel circuit joining regions are spaced apart by the transparent regions.

3. The display panel according to claim 1, wherein in the pixel regions forming the pixel circuit joining region, two ends of the transparent regions of two adjacent pixel regions are connected to each other and surround the pixel circuit joining region.

4. The display panel according to claim 3, wherein the pixel circuit joining region comprises the pixel circuit regions of four pixel regions, wherein areas of the transparent regions of the four pixel regions are equal, and areas of the pixel circuit regions of the four pixel regions are also equal.

5. The display panel according to claim 4, wherein a shape of the pixel circuit joining region is a rectangle, and a shape of the pixel circuit regions is also a rectangle.

6. The display panel according to claim 4, wherein a shape of the pixel circuit joining region is a rhombus, and a shape of the pixel circuit regions is a triangle.

7. The display panel according to claim 1, wherein the display panel further comprises a light-emitting unit, the pixel circuits provide a driving signal to the light-emitting unit, and the light-emitting unit comprises an anode, a light-emitting layer, and a cathode, which are disposed in a stack.

8. The display panel according to claim 7, wherein the anode, the light-emitting layer, and the cathode are arranged corresponding to the pixel circuit regions.

9. The display panel according to claim 7, wherein the light-emitting layer is disposed corresponding to the pixel circuit regions, and the anode and/or the cathode shares the pixel circuit regions and the transparent regions, wherein the anode and/or the cathode are made of a transparent material.

10. A display panel, comprising:
a base substrate;
a plurality of gate lines arranged along a row on the base substrate and a plurality of data lines arranged along a column on the base substrate, and the base substrate further comprising pixel regions arranged in an array;
wherein the pixel regions comprise transparent regions and pixel circuit regions, and the pixel circuit regions comprise pixel circuits; and
wherein the pixel circuit regions of at least two adjacent pixel regions are disposed next to each other and form a pixel circuit joining region, so that the pixel circuit regions of a same row or a same column of the pixel regions are arranged spaced apart from each other, two adjacent pixel circuit joining regions are spaced apart by the transparent regions, and a border line between the transparent regions and the pixel circuit regions is a straight line, a zigzag line, or a curved line.

11. The display panel according to claim 10, wherein the pixel circuit joining region is formed by at least three pixel regions arranged in the same row or the same column, wherein the pixel circuit regions of the at least three pixel regions in the same row or the same column are arranged next to each other, and each of the pixel circuit regions disposed at two ends of the pixel circuit joining region has an area smaller than an area of other pixel circuit regions, so that the two adjacent pixel circuit joining regions are spaced apart by the transparent regions.

12. The display panel according to claim 10, wherein in the pixel regions forming the pixel circuit joining region, two ends of the transparent regions of two adjacent pixel regions are connected to each other and surround the pixel circuit joining region.

13. The display panel according to claim 12, wherein the pixel circuit joining region comprises the pixel circuit regions of four pixel regions, wherein areas of the transparent regions of the four pixel regions are equal, and areas of the pixel circuit regions of the four pixel regions are also equal.

14. The display panel according to claim 13, wherein a shape of the pixel circuit joining region is a rectangle, and a shape of the pixel circuit regions is also a rectangle.

15. The display panel according to claim 13, wherein a shape of the pixel circuit joining region is a rhombus, and a shape of the pixel circuit regions is a triangle.

16. The display panel according to claim 10, wherein the display panel further comprises a light-emitting unit, the pixel circuits provide a driving signal to the light-emitting unit, and the light-emitting unit comprises an anode, a light-emitting layer, and a cathode, which are disposed in a stack.

17. The display panel according to claim 16, wherein the anode, the light-emitting layer, and the cathode are arranged corresponding to the pixel circuit regions.

18. The display panel according to claim 16, wherein the light-emitting layer is disposed corresponding to the pixel circuit regions, and the anode and/or the cathode shares the pixel circuit regions and the transparent regions, wherein the anode and/or the cathode are made of a transparent material.

* * * * *